United States Patent [19]

Seeger

[11] Patent Number: 4,767,665
[45] Date of Patent: Aug. 30, 1988

[54] ARTICLE FORMED BY ELECTROLESS PLATING

[76] Inventor: Richard E. Seeger, Captains Way, Kittery Point, Me. 03905

[21] Appl. No.: 776,464

[22] Filed: Sep. 16, 1985

[51] Int. Cl.$^4$ .......................... B32B 15/08; B32B 5/00; B05D 3/10
[52] U.S. Cl. .................................... 428/328; 428/457; 428/901; 428/458; 428/461; 427/304; 427/306
[58] Field of Search ............... 428/328, 901, 704, 457, 428/469; 427/305, 306

[56] References Cited

U.S. PATENT DOCUMENTS

| | | |
|---|---|---|
| 3,625,730 | 12/1971 | Lee . |
| 4,119,763 | 10/1978 | Blair .................. 428/469 X |
| 4,197,218 | 4/1980 | McKaveney . |
| 4,281,038 | 7/1981 | Ambros et al. . |
| 4,379,803 | 4/1983 | Tamai et al. .................. 428/328 |
| 4,390,458 | 6/1983 | McKaveney .................. 252/503 |
| 4,404,237 | 9/1983 | Eichelberger et al. . |
| 4,424,095 | 1/1984 | Frisch et al. .................. 428/901 X |
| 4,447,492 | 5/1984 | McKaveney . |
| 4,456,712 | 6/1984 | Christie et al. .................. 428/901 X |
| 4,541,894 | 9/1985 | Cassat . |

FOREIGN PATENT DOCUMENTS 1186558 4/1970 United Kingdom .

Primary Examiner—John E. Kittle
Assistant Examiner—Susan S. Rucker
Attorney, Agent, or Firm—Polster, Polster and Lucchesi

[57] ABSTRACT

This invention describes a platable plastic material that uses a phosphide compound as a filler at levels of 5 to 40 weight percent. The phosphide filler used in this way has good dielectric properties and is non-conductive, but the phosphide provides coupling sites for a conductive plating to initiate and to bond to the filler and thus to the plastic. Surface treatment of the plastic may be needed to expose the particles but this invention removes requirements for catalytic treatment with noble metal chlorides and relies on bonding mechanisms other than the mechanical grip on a rough surface.

16 Claims, 3 Drawing Sheets

ARTICLE FORMED BY ELECTROLESS PLATING

FIELD OF INVENTION

This invention relates to the plating of plastics with metals.

Secondary fields are fillers for plastics and chemical initiation of plating processes.

BACKGROUND OF THE INVENTION

Trim for automobiles, home housewares, toys and numerous other plastic parts are plated for appearance. In other cases the conductive layer is plated for electronic uses such as shields for electronic devices. The actual paths between the chips in some circuit boards are plated as the main conductors thus replacing wires with narrow strips or bands of copper or other metals.

Plating itself can use an electrode and requires a conductive surface that the electrolyte is deposited upon with the electrical motivating force applied externally or can be electroless where the metal is deposited from a chemically active solution. In some applications of plating on plastics the electroless plating process is used to form a thin conductive layer, then the conventional electrode plating is used to deposit a thicker layer or a different metal on the now conductive lightly plated surface of the plastic. In other cases a brief immersion in a highly unstable solution is used to form a very thin conductive layer then a thicker layer of high quality is added in a less unstable electroless plating solution.

The initial plating on plastic is usually electroless plating and can be initiated by several mechanisms. The most common method uses a catalytic coating of solutions of noble metal chlorides such as $PdCl_2$. This common method requires that each part be processed through a dip, and the materials are very costly. In addition, the adhesion to the plated parts is limited because of the lack of bonding between the metal layer and the plastic. A common way to increase the adhesion is to mechanically roughen the surface to cause more pits and grooves. The pits and grooves are also beneficial in holding more of the catalytic agent. These surface irregularities act to trap the plated layer and thus form a mechanical bond. This is an extra step and the added roughness increases the use of catalyst solution.

Another problem with the catalyst/rough surface method occurs where a partial or localized plating is needed. The catalyst must be removed from all but the areas where the plating is desired, then masks or other shields are used to selectively deposit the plating on the exposed areas. If the unstable catalysts are not completely removed they can form unwanted electrical paths and create quality problems.

In a method to cure the poor adhesion, a vapor blast treatment of the plastic part is used. In the blasting, metallic particles are driven into the plastic as either small particles of metal or as metallic catalytic salts to form a mechanical penetration of the surface and give better adhesion in the subsequent plating step. The metallic particles are then the initiation points of the plating. This method is very labor intensive and the adhesion levels are again limited to the levels of the particle to plastic adhesion. The metals and metal chlorides used in this process can be catalytic, but this still does not increase the adhesion above the adhesion of the metals driven into the surface of the plastic. One advantage of this system is when compounds that are expensive, such as $PdCl_2$, are used only the surface layer is treated. The problem of localized plating is still not solved with this method, and the only way to limit the plating area is with unweildly masks that are then removed. Three dimensional objects such as holes and bosses are also nearly impossible with this method because of the difficulty of impinging on such partly shaded surfaces.

A logical method to cure the lack of three dimensional plating would be the bulk dispersion of the catalyst or of a metal powder. The cost of use of the catalyst throughout the plastic has been prohibitive and the use of metal particles as a bulk filler has caused conductivity of the plastic and very low dielectric breakdown that makes this method useless for electrical applications.

In addition to the conductivity problems, the metal powders are not catalytic but react due to the differences in reactivity of the metals. This means that copper in a plating solution is exchanged for the more active iron ions in a direct substitution reaction. As seen in the recovery of copper sulphate wastes, this type reaction results in the contamination of the baths with the substituted metal. This contamination limits the life of the solutions and creates disposal problems. Since in these substitution reactions for every ion deposited an ion of the more active metal enters the plating solution, these reactions are easily indentified by the contamination in the plating solutions.

Yet another method uses an inert filler coated with a catalytic material such as $PdCl_2$ in a thermosetting chemically cured resin. While the advantages of firmly locking the catalyst coated particles in the resin are obvious, the amount of the expensive Pd compounds used limits the use of this method. The limitation to only thermosetting resins is more serious since these cannot be processed with the ease and the speed of thermoplastic resins. Use of this technology at the temperatures involved in processing thermoplastics can destroy the unstable catalytic materials. With this method, it is nearly impossible to plate in limited areas and to plate details. The technique is, however, good for holes and for three dimensional surfaces.

A new General Electric process takes advantage of the substitution process in thermosetting matrices by adding metal powders to an ink-like plastic matrix. This method has the contamination problems mentioned above since the reaction is substitution and is limited to the thermoset or paint-like matrices. This process can be used to print patterns and reach into three dimensional objects, which makes it useful for some specialty areas and it allows the paint/polymer materials to bind to the surface of the substrate.

Most of the existing methods of providing platable plastics fail in the ability to plate fine details, and they also have either problems of adhesion to the plastic or serious cost problems. Adhesion is a major problem in uses such as automotive trim parts, door knobs and related decorative objects and the detail problems prevent combinations of graphics with plating.

The times of plating are also a concern. The substitution reactions are relatively fast with a 5 to 10 minute initial flashing followed in some cases by a much longer buildup of plating thickness after the surface is coated so no further substitution can occur. With catalytic action the rates tend to be much slower, and it make take an hour to form the initial layer and then the rate becomes about the same as the rate for the substitution reaction. It is not unusual to use a series of plating baths to optimize the rate and quality of plating.

SUMMARY OF THE INVENTION

It is an object of this invention to provide a material that is platable in an electroless plating solution without the use of catalytic activation of the surface.

Another object is to provide a novel platable substrate which is a good dielectric to circuit element on its surface and is non-conducting to prevent short circuits in such circuitry or in subsequent plating steps.

Another object is to provide such a substrate which permits localized plating with no problems of catalyst breakdown and the resulting unwanted conductive paths.

Another object is to provide a lower cost and less labor intensive method to plate plastics.

Another object is to provide such a material, substrate, and method which permit complex shapes, through holes, and other three dimensional surfaces to be easily plated.

In accordance with one aspect of the present invention, generally stated, an electrolessly platable, non-conductive material is provided comprising a particulate metallic phosphide compound and an insulative material, the phosphide compound comprising between five and forty percent by weight of the platable material. Non-conductive materials are conventionally distinguished from conductive or semiconductive materials by having a volume resistivity greater than $10^9$ ohm-cm. See, for example, Hughes, Stephen, and Brown, "Dictionary of Electronics and Nucleonics" (Barnes & Noble, New York, 1970) and Lapades, "Dictionary of Physics and Mathematics" (McGraw-Hill, New York, 1978). As used in the present specification and claims, the terms "non-conducting" and "non-conductive" indicate materials having a volume resistivity greater than $10^9$ ohm-cm.

The preferred metallic phosphide compound is iron phosphide. Preferably, the particulate phosphide has an average particle size of between about 1 to 10 microns. In the preferred embodiments the mean particle size is between about 3 and 5 microns.

The insulative material is preferably an organic resin. The preferred resins are thermoplastic polymers.

The invention uses a combination of fillers in one preferred embodiment to aid in exposing the surface particles thus providing a higher number of points of attachment for a plating solution to deposit the conductive metals.

The article of the invention is formed into a self-sustaining substrate from the preferred material by standard forming methods, such as molding. The substrate may have a layer of metal plated directly on one or more of its surfaces by the method of the invention, and the substrate may be laminated to other substrates. The article may be a plastic part plated for appearance or it may be an electronic shield or a printed circuit board.

The method of the invention includes uniformly dispersing ten to forty percent by weight of particles of phosphide in a plastic and forming the composite into a nonconductive article. In a following step, the article is plated with a conductive layer by electroless plating. The method provides a low-cost plating process because it does not depend on expensive electroless plating baths containing $PdCl_2$ catalysts. The method also improves the adhesion of the plating to the plastic by bonding to particles of phosphide which have been compounded into the plastic thus embedded the phosphide particles in the plastic.

In this invention it is anticipated that in most cases the surface of the plastic will be disrupted to remove a thin skin of polymer on the surfaces of the filler particles thus exposing them to the plating solutions. Electromagnetic radiation focused on the plastic surface, oxidation by plasma jets, or by ozone generated in a high frequency treater or in a ozone generator or by flame treating, and chemical soak solutions to etch the surface are among the ways to expose the surface. Actual physical abrasion by sanding, abrasive blasting or with a wire wheel will also adequately expose the surface fillers to a plating bath.

The phosphide reaction involved is not well understood.

The detailed chemistry at the sites of initial attachment between the phosphide and the metal ions in the plating bath is best defined in negative terms. Working with defining what it is not, the use of iron phosphide, aluminum phosphide, or copper phosphide does not involve a more noble metal than the copper in the plating bath. Since this is one of the usual requirements for a catalytic reaction this seems not to be catalytic in nature. There are few catalytic reactions in the metals area that employ iron in any case. Likewise, if this were a simple replacement reaction, the plating bath would rapidly be contaminated with iron in the case of iron phosphide as the filler. The fact that this contamination also does not happen indicates that the reaction is not a simple substitution. It thus appears that the phosphide portion of the molecule has an importance in the reaction. The effect of the phosphide radical on plating was unexpected and there is no textbook example to use for the reaction mechanism.

The testing or iron oxides as a check on the effect of the iron portion of the molecule in a relatively stable molecule showed no tendency to initiate a coherent plating film, thus the importance of the phosphide was reinforced. The key factor is that of a great number of filler minerals, only the phosphides seems to have an effect on the plating process in the stable non-noble metal salts. Stable is regarded as a mineral or salt that is effective and does not break down at temperatures of 400 degrees F.

The actual reaction seems to involve coordination between the phosphide radicals and the metal in the plating bath and may involve a bonding analogous to the hydrogen bonding seen in organics. Despite the usual low binding force of this type of bond, the employment of a number of sites and the varied orientation of these sites results in adherent deposits. The actual degree of adherence is compared with the other mechanisms of attachment where a treated surface is activated but the adherence relies on the surface roughness alone. Compared to the surface attachment the phosphide attachment is at least one and one half times stronger.

Several factors have relevance to the strength of the bond. As the particle size decreases there is less of the surface for the polymer to bond to and the metal-phosphide attachment may fail due to breakdown of the polymer to particle bond. The other factor is the spacing between the particles with the optimum spacing being in the area of 0.0003 inches but where too great a spacing causes a loss in tack points and thus reduces the adhesion. Excessive spacing also cuts the growth of the copper deposit and thus slows the formation of a coherent conductive layer or even inhibits this formation.

Strength is a term that refers to either the direct pull test where a ¼" disk is epoxy glued to the metal layer and pulled in a tensile test machine or the other cross hatching of the deposit with a razor cutter and an adhesive tape pull on the cut areas. Both of these tests indicate some features of the adhesion of the plating.

In the razor cross hatching test the deposit for a phosphide adhered metal deposit there is rarely a speck that is pulled off the part. For other processes the removal of two or more specks is not unusual and in some cases as much as 50% of the deposit is removed. This shows a better attachment of the plating to the plastic. In the tensile test, micrscopic examination occasionally shows the phosphide filler particle pulls off the plastic which is an indicator of superior bonding.

The size of the particles does not have a major effect on the strength as determined by the razor cross hatching test but with particles much over 10 microns in average diameter the amount of fill required to achieve a between particle spacing that will easily form a coherent conductive layer presses the current capability to add the material to plastic and achieve a particle wetted by the plastic and moldable. As the size of the particle grows the expectation is that the polymer to particle bond will improve due to the larger surface coated by the plastic. In our experiments this was not noted and this lack of increasing adhesion with increasing particle size was probably countered by the reduced number of particles in the larger sizes.

The low end particle size tested was slightly over 1 micron. While there is expectation that any small size particle will work in this process, the 1 micron particles were very hard to handle and there is a possibility that the sub micron size particles will have the process problems common with fine carbon black where the material is both hard to filter from the air and hard to mix in resin without addition of oils to act as wetting agents to hold the fine powders. The one micron powders are effective in the process and despite the smaller wetted perimeter on the particle, the adhesion to polymers remained excellent. The adhesion to the plating was also excellent as tested by the razor cross hatching test.

The commercial forms of the iron phosphide are a by-product of the production of phosphorous and its compounds and are available in two pigment grades. The particle size of the commercial grades are either 3.0 or 5.0 microns in diameter. They are angular which, while a natural form of this mineral, will help in embedding the particles in plastics. The samples tested were produced by the Occidental Chemical Corp. and sold as Ferrophos. The content of the Ferrophos is 99+% $Fe_2P$ and the contaminants of $SiO_2$ and FeP seem not to have a role in the plating bath reactions.

The Ferrophos material is commonly used in the enhancement of corrosion resistant primer paints where it partly replaces zinc, as disclosed for example in U.S. Pat. No. 3,562,124 issued in 1971. The zinc replacement is not relevant to this patent application. The common name for the filler is Ferrophosphorus in addition to the trade name Ferrophos and is a ORM-A hazard class with no special safety shipping restrictions. With a specific gravity of 6.53 and an apparent density of 19 lbs. per gallon it is approximately 6.6 to 5.2 times denser than the resins it is mixed into. While the material is nominally electrically conductive, when mixed with the plastic materials the composite becomes non-conductive. The material is an excellent thermal conductor and this property, while somewhat diminished by compounding with the plastics, remains high for filled plastics.

Several other properties of the iron phosphide are of interest. It is of neutral pH which prevents the property degradation of some reactive polymers such as polybutylene terephthalate (PBT which is a type of polyester). The typical oil demand of the material is between 8 and 11 gms of linseed oil per 100 gms of iron phosphide for 3 and 5 micron fillers.

There is less information on the copper and the aluminum phosphides and these materials were available only through laboratory supply houses. The aluminum phosphide was used for coatings but is no longer made. Small samples were tested and seemed to react similar to the iron material.

The polymers used in the testing ranged from polypropylene representing the polyolefins through the polyesters (PBT) to the exotic engineering plastics such as polysulfone and the polyether imides which have applications at very high temperatures. The specifics of resins are noted in the examples that follow. The mechanism worked in all tested resins, suggesting this is a filler for any thermoplastic plastic.

The high loading levels suggested a low viscosity resin but a combination of heat and extrusion conditions had to be used to compound the materials. As lower viscosity resins are located the upper limit of the filler loading could be increased to as much as 50 weight percent. The current maximum loading in tests was 40 weight percent and the resulting product in some ways resembled a ceramic rather than a flexible plastic with breakage possible on moderate impact.

DESCRIPTION OF THE PREFERRED EMBODIMENTS

Figure 1:
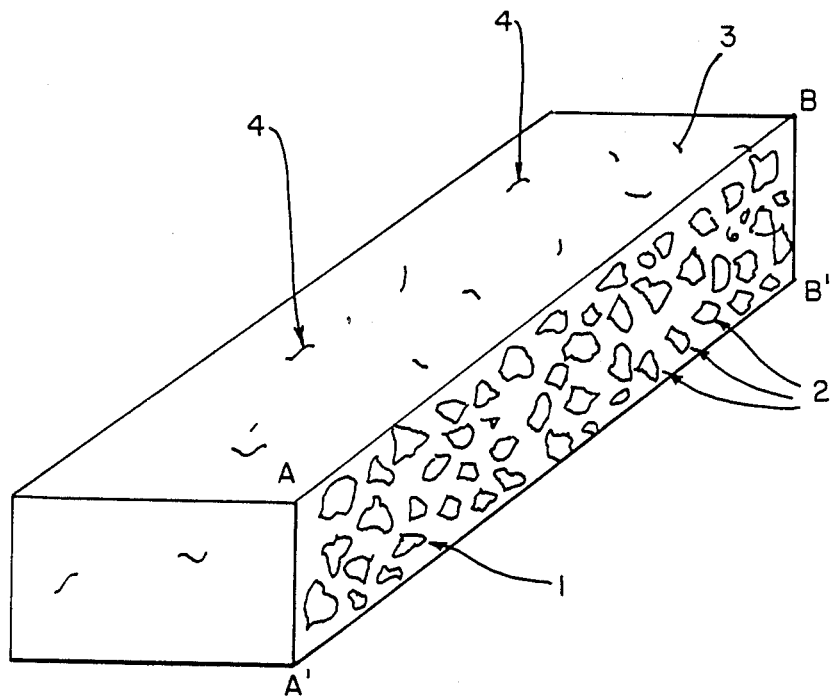
FIG. 1 shows a compound of the filler (2) in a thermoplastic substrate (1) with a side A A' B B' exposed to show the internal random arrangement of the filler which is evenly dispersed in the thermoplastic. Typical of formed plastic parts, a thin skin (3) covers most of the external surfaces and covers the filler in part at the surface. Some of the filler is exposed through this skin as shown by (4).
Figure 2:
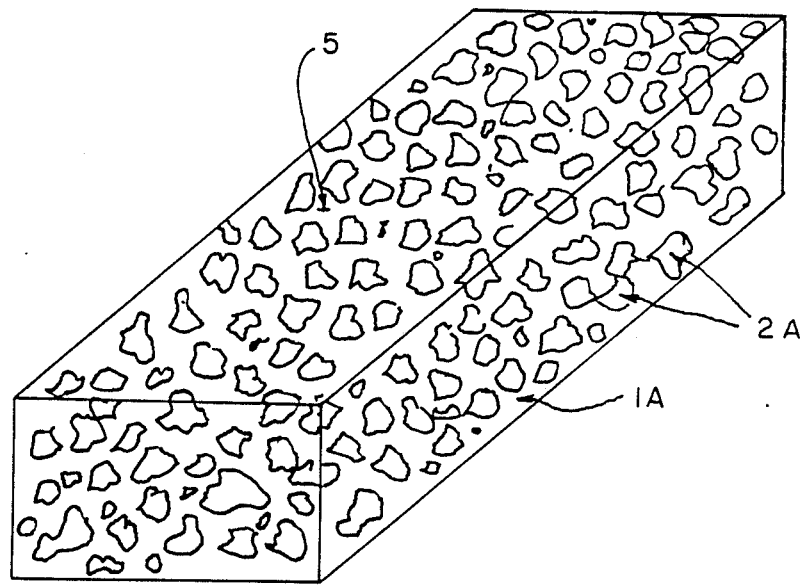
FIG. 2 shows the same material with the thermoplastic material (1A) and the distributed filler particles (2A) throughout the material. In this figure the plastic surface skin in FIG. 1 number 3 has been removed by chemical or physical means thus exposing the particles (2A) that are on the surface of the part. A rare inclusion particle (5) that is an artifact of some oxidizing surface film removal techniques is also shown.
Figure 3:
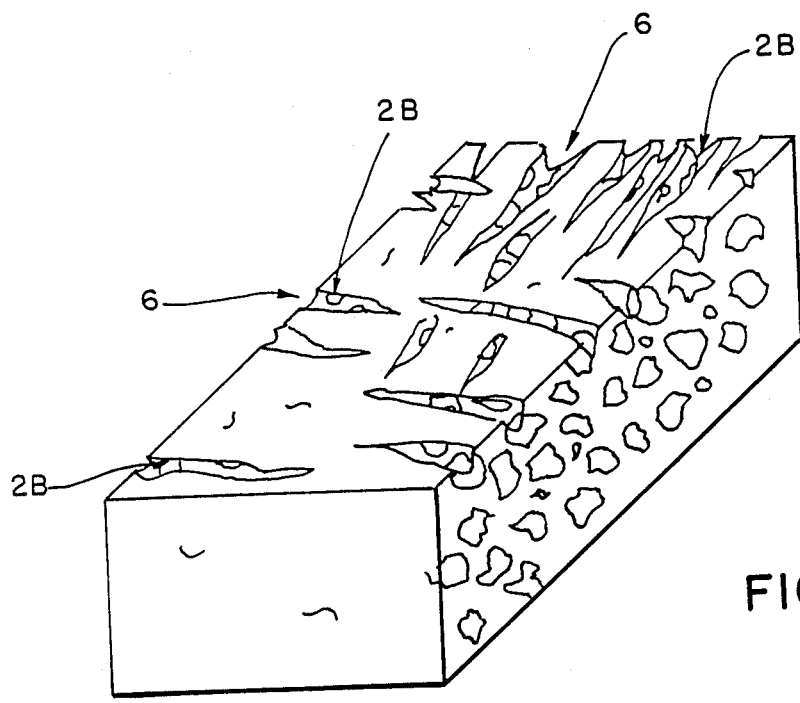
FIG. 3 shows the plastic in FIG. 1 with physical abrasion of the surface causing grooves (6) that expose the filler particles (2B).
Figure 4:
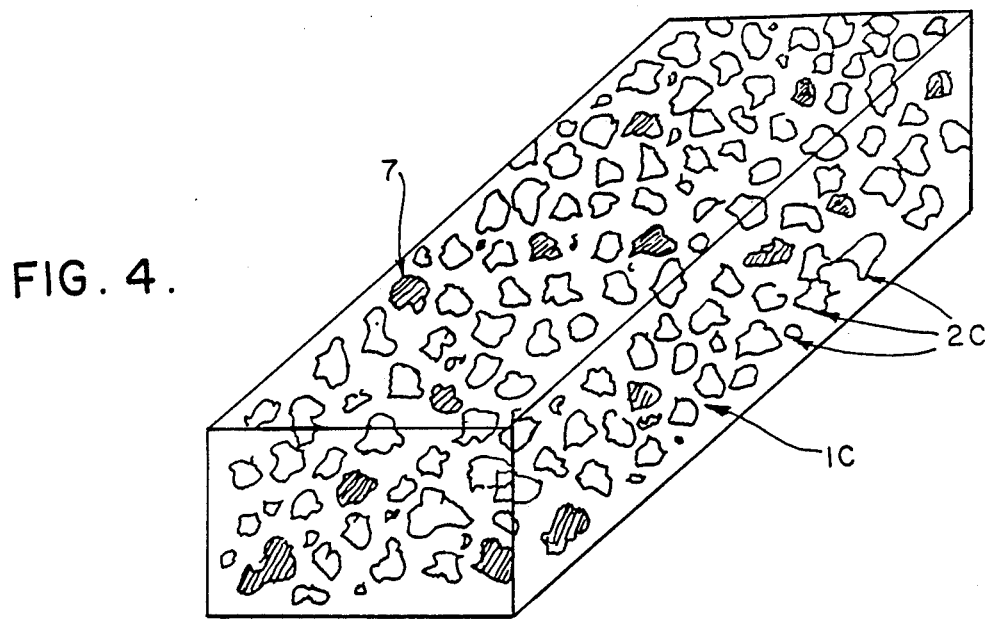
FIG. 4 shows the compound of FIG. 2 with an added co-filler which serves to assist in the exposing of the surface. The co-filler is typically calcium sulfate shown as (7). The phosphide filler (2C) and the thermoplastic resin (1C) remain as in FIG. 2.
Figure 5:
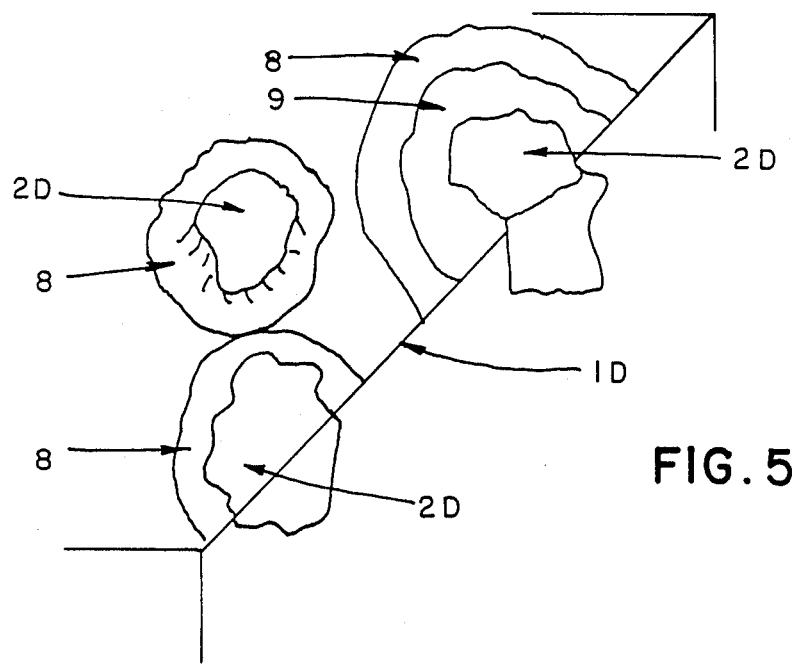
FIG. 5 shows an enlarged view of three particles (2D) on the surface of the plastic (1D) shown in FIG. 2 after a brief immersion in an electroless plating bath. The copper deposit initiates on and is bound to the individual particles of the filler (2D) and grows in roughly concentric rings (8,9) from the initiation point.
Figure 6:
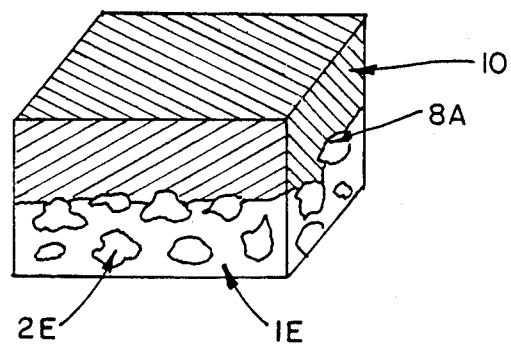
FIG. 6 shows the conductive layer (10) on top of the plastic substrate (1E) with the conductive layer firmly bound to filler particles (2E) at their points on contact (8A).
Figure 7:
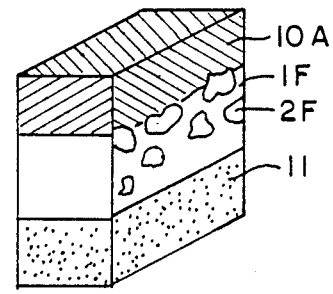
FIG. 7 shows the thermoplastic material (1F) with exposed filler (2F) to which is adhered a conductive layer (10A) on one side and to which is adhered on the other side one or more other plastic or ceramic layers (11).

The following examples are illustrative of the materials, methods and articles of the present invention.

Example 1

Preparation of Material

In one preferred embodiment, a polybutylene terephthalate resin such as Volax 310 resin manufactured in the Mt. Vernon IN plant of General Electric Co. was used as the thermoplastic resin. This resin was compounded in a single screw extruder with 20 weight percent of iron phosphide such as Occidental Chemical Co. Ferrophos Superfine HRS 2131 with an average particle size of 5.0 microns and a maximum particle size of 22 microns. The phosphide was placed in a hopper which discharged onto a weigh belt feeder. This feeder was slaved off a second hopper weigh belt feeder into which the PBT resin was placed.

The single screw extruder was a 24:1 Hartig machine which employs a wave type screw such as made by Prodex Corp. of Mansfield, Ohio. This screw has two segments to each turn with cam shapes, each segment in opposition to the other segment and with a lower barrier between the segments. The shape of the screw provides a kneading action to the plastic as the main flow is squeezed from segment to segment by the cam shape. The tops of each cam and the flights of the screw were coated with a Colomonoy welded wear protection to prevent the rapid erosion of the metal. A bimetal barrel on the extruder which serves as the outer contact surface for the polymer mix was also of a wear resistant alloy. A 75 Hp DC drive with field weakening to ensure maximum startup torque was used on the extruder and it is supplied with 4 heating and cooling zones controlled by thermocouples.

The materials are introduced into a tangential feed section by two weigh belt feeders set to ratio the inputs at either a high rate which slightly exceeds the ideal input to the extruder or at a low rate which is about 75% of the ideal rate to the extruder. An automatic level sensor in the extruder feed throat switches the feed rates between high and low to maintain a nearly constant level of 11 to 13 inches above the extrusion screw.

The extrusion process runs at a constant 80 rpm with heats set as follows:

| | |
|---|---|
| Extruder throat | 290 degrees F. |
| Zone 1 near throat | 325 degrees F. |
| Zone 2 | 400 degrees F. |
| Zone 3 | 450 degrees F. |
| Adaptor and die | 475 degrees F. |

The die was a 14 hole die with ⅛" holes arrayed in two rows ¼" apart and staggered so no hole was above another. The strands from this die were promptly allowed to sag into a water filled trough with 140 degrees F. water and then blown off by two opposing blasts of air that remove the water. The strands were moving at 18 feet per minute through a 10 foot long bath. Hot water was important in maintaining flexibility in the strands and thus preventing broken strands.

The strands were chopped in an 8" wide Cumberland grinder into ⅛" long pellets. The retained heat of processing was sufficient to dry the pellets.

Example 2

Molding of Plaques

The pellets were taken to an injection molder that transformed the pellets into test plaques. We selected the step chips for plating trials. These chips are 3 inches wide and 3 inches long and one end is 0.060 inches thick for a half inch then it steps up to 0.120 inch thick for another half inch where it again steps to 0.180 for a half inch then steps to 0.220 inches for the remaining length of the chip. This type was selected to show moldability and to expose several thicknesses to the test solutions.

The molding was done in a Reed ram type molding machine with a 275 ton clamping force. The temperature in the ram area was set at 450 degrees F. and the injection nozzle was at 490. The machine was large for this use but worked well and a number of plaques were produced.

The plaques on microscopic examination showed little exposure of the filler and most of the surface was resin. Several methods of removing the resin skin which is shown in FIG. 1 of the drawings were employed. These will be described in the plating section of the embodiments.

Example 3

Preparation and Molding of Filled Material

A modified form of the material of Example 1 was made with the same equipment and materials as the example above but a third hopper and weigh belt feeder was used to add 5 weight percent of calcium sulfate to the resin and iron phosphide entering the extruder throat. In this test the same conditions as noted above were used. The resin when compounded had a higher than expected flow, nearly 25% greater flow than the first example. This difference was attributed to the partial breakdown of the resin due to the calcium sulfate but the plaques were judged of acceptable quality.

Example 4

Preparation and Molding of Lower Temperature Materials

Another embodiment of the compounding processes was done using a continuous mixer as sold by the Farrell Company in CT. This mixer is a device to produce very high shear levels in very viscous materials and consists of a short feed screw about two times the screw diameter length of approximately 3 inches. The working area consists of two rotating blades with a ⅛ inch gap between them. The blades are somewhat like the sigma blender blades but they are solid and heated. The outer jacket of the mixer which is less than 15 inches long is also heated or cooled.

The mixer was used to add 20 weight percent of the phosphide to polypropylene resin such as produced by Exxon Plastics with a 50 melt index and a 0.89 specific gravity for the homopolymer. The mixer used in this case was a portable cement mixer and the problem of the iron phosphide settling to the bottom of the tumbler was cured by adding the resin and then tumbling it with ¼ percent by weight of mineral oil. This coated the pellets of polypropylene with a light layer of oil. Upon adding the iron phosphide powder the fine phosphide particles adhered to the oil layer and did not settle to the bottom of the drum. Past tests have shown the mineral oil vaporizes in the extrusion step and has no effect on the plastic.

The Farrell mixer, a common compounding device was supplied resin from a hopper. The rotors were rotating at 120 rpm and the resin was introduced with the machine cold then the outer jacket was heated to 250 degrees F. At this temperature the exit port which was 33% open showed a melted index had replaced the powder that was produced at lower temperatures where the melting did not happen. This melted stream was collected in lumps of one to two pounds and hand conveyed to the throat of a 8 to 1 pumping extruder. This pump functioned to develop enough pressure to force the pre-melted polymer through a strand die then it was pulled through a short water bath, blown dry and the strands were chopped into pellets.

The pellets were molded as in the first example into step chips.

This test was also run with the polypropylene and iron phosphide with 7 weight percent of calcium sulfate using identical conditions. These samples were also molded into step chips.

Example 5

Preparation and Molding of Higher Temperature Materials

Another embodiment of this invention used a German made Reifenhauser extruder adapted to the extrusion of Ultem resin. Ultem is a polyetherimide made by General Electric in Mt. Vernon IN. This resin in the 1000 grade was compounded in a 28:1 L/D extruder with the single screw melting the resin in zones 1 and 2 of the barrel then a secondary addition port was used to add 15 weight percent of the iron phosphide to the resin. Weigh belt feeders were employed to assure the correct ratio by metering the material in at each entry port in the barrel.

The extruder was modified to reach 800 degrees F. in any zone of the barrel by use of bronze cast heater bands and temperature controllers with much higher range than normal. The rear zone was set at 500 degrees F. while the remaining 4 zones were at 740 degrees F. The die was at 800 degrees.

The cooling and chopping of the strands into pellets was as in the first example.

Injection molding was done in the Reed machine as noted previously but the temperatures were held at 790 degrees F. Step chips were made as in all other examples.

Example 6

Preparation and Molding of Thermosetting Material

Yet another embodiment of the invention was the mixing of the iron phosphide with a catalysis activated epoxy resin in a ratio of 80 parts of the resin and catalyst by weight and 20 parts by weight of iron phosphide of 3 micron size.

The resin and filler were well mixed with a stirring rod until the sample appeared to be uniform.

The sample was then poured into a polyethylene lined foil pan approximately 2 inches by 3 inches in size to a thickness of 3/16 inch.

The sample in the pan was allowed to cure overnight.

The samples were then treated for plating.

Example 7

Surface Preparation of Plaques

The samples in the preparation stages of the foregoing Examples had been reduced to a stack of small step chips for the various formulations and preparation methods. One chip was not touched with any of the other preparation steps while one chip was prepared in the following ways:

1. Chips were prepared by surface abrasion in two ways. The first of the chips was sanded with fine emery paper made by the Carborundum Company of Niagra Falls NY. The sanding was done 10 strokes in one direction then the direction was changed and the chip was stroked 10 times in the other direction with a new sheet of emery paper. The resulting fine scratches were at right angles to each other on the surface with the last direction predominant. The surface was completely scratched.

2. Other chips were immersed in dmf solvent which etched the surface causing a cloudy appearance. The chips with a co-filler such as calcium sulfate were especially well etched.

3. A laser used for cutting fabrics was briefly passed over the surface of the chip and a line of cloudy rough surface was seen where the laser traversed the surface.

4. An electrostatic treater was passed over the surface of the chips and there was a strong ozone smell developed that indicates surface oxidation. A Pillar unit with a solid aluminum electrode was used to direct the high frequency electrical field.

5. The final surface treatment was the application of a propane blow torch flame to the chip surface. The center light blue flame tip within the flame cone was used to touch the surface and the flame was held for two to four seconds which was enough to melt the surface but it marked to surface slightly. The co-filler sample seemed to show the most effect of the flame. Any heat and oxidizing source would be expected to work well on this pre-treatment.

The treated chips were then set into plating baths as indicated in the following descriptions.

Example 8

Plating of Plaques

The chips which were surface prepared by a variety of means were then placed in plating baths and checked for deposition.

The first bath employed is a common electroless bath that is used as a sole plating solution. It consists of 0.03 moles per liter of copper sulfate, 0.125 moles per liter of sodium hydroxide, 0.0004 moles per liter of sodium cyanide, 0.08 moles per liter of formaldehyde, and 0.036 moles per liter of tetra sodium ethylenediaminetetraacetate (EDTA), with the remainder being water. This commonly used bath when operated at a temperature of near 55 degrees Celsius will deposit a 1 mil layer of copper in slightly more than 2 days. The chips in this solution showed cloudy initial depositing in 2 to 5 hours and all had a 1 mil coating within 58 hours.

A more common application of the plating baths is to briefly use a bath of a typical composition of 0.05 moles per liter of copper sulfate, 0.115 moles per liter of N-hydroxyethylenediaminetriacetate, 0.0016 moles per liter of sodium cyanide, 0.008 moles per liter of sodium borohydride, with the balance of water and maintaining the temperature at 28 degrees C. and adjusting the pH in the very basic area of 13 to 13.3. This bath is employed to start the deposition of the copper then the part with a flashing of under 0.1 mil of copper is placed in a more stable bath such as a solution of 0.05 moles per liter of copper sulfate, 0.05 moles per liter of sodium hydroxide, 0.0002 moles per liter of sodium cyanide, 0.032 moles per liter of EDTA, 0.08 moles per liter of formaldehyde with the balance being water and the bath is operated at 55 degrees Celsius to deposit a mil of copper in 22 hours.

The best success with the phosphide activation of the plating bath is the use of a highly unstable initial plating bath for initiation with the subsequent bath of lesser importance. The second example is a better way to plate and the initiation in the first bath of the second example can also be followed by baths such as the one in the first example.

In the plating baths shown the deposition was with difficulty in the second set of solutions on the untreated samples but the plating initiation was noted in 2 to 5 hours in a moderately active solution as in the second example in the treated samples. From this result it is noted that there is a minimum amount of exposed phosphide needed for successful plating inititation. Since a wide variety of plating samples show good deposition with a wide range of surface treatments it should be inferred that the phosphides are powerful initiators and the mere presence of a number of closely packed exposed surfaces will provide an initiation of the plating process.

The plating process inception as defined by the first layer of copper molecules on the part was a lengthy process as compared with the substitution process which takes only minutes. As compared with common processes of electroless deposition there is a small difference in time since these processes are both dependent on the slow rates of deposition on a copper base and are independent of the initiator after the first molecular layer of copper is deposited.

The surface conductivity of the plaques was good showing less than one ohm after the 5 hour initiation. With this conductivity the parts made of this material and with an initiated layer of electroless plating would also be good candidates for conventional second step plating employing electrodes. The low cost of the material and the ease of compounding should result in considerable savings in decorative plating as used in toys and automotive trim. Avoiding the electroless plating baths for most of the deposition cycle speeds the total plating and permits the use of automated plating systems. Another factor giving savings to the decorative plater is the avoidance of expensive catalyst solutions.

I claim:

1. An article of manufacture formed by an electroless plating process, the article comprising a formed, non-conductive self-sustaining substrate, the substrate comprising a non-conductive organic resin and a particulate metallic phosphide compound distributed through the organic resin, the particulate metallic phosphide rendering the substrate more easily directly electrolessly platable while maintaining the substrate electrically non-conductive, and a layer of metal plated directly on at least one of the surfaces of the substrate.

2. The article of claim 1 wherein the phosphide compound comprises between five and forty percent by weight of the substrate.

3. The article of claim 2 wherein the phosphide compound is iron phosphide.

4. The article of claim 3 wherein the particulate iron phosphide has an average particle size of between about 1 to 10 microns.

5. The article of claim 1 wherein the particulate metallic phosphide has an average particle size of between about 3 to 5 microns.

6. The article of claim 1 wherein the major part of the substrate by weight is an organic resin.

7. The article of claim 6 wherein the organic resin is a high temperature thermoplastic resin chosen from the group consisting of polyetherimides, polybutylene terphthalates, polyethylene terphthalates, polyimides, polysulfones, and copolymers thereof.

8. The article of claim 6 wherein the organic resin is a thermoplastic resin chosen from the group consisting of polyolefins, polystyrenes, acrylonitrile-styrene copolymers, vinyls, polycarbonates, and acrylics.

9. The article of claim 6 wherein the phosphide compound comprises between five and forty percent by weight of the substrate.

10. The article of claim 9 wherein the metal layer is plated to portions of the surface from which a skin has been removed.

11. The article of claim 10 wherein the substrate is a printed circuit board and wherein the metal layer comprises circuit elements deposited directly on the substrate.

12. The article of claim 11 wherein the metal layer includes plating of through holes in the substrate.

13. The article of claim 10 wherein the phosphide compound is iron phosphide.

14. The article of claim 13 wherein the particulate iron phosphide has an average particle size of between about 3 to 5 microns.

15. The article of claim 6 wherein the substrate is further filled with filler means for assisting the exposing the portions of the surface.

16. The article of claim 6 wherein the organic resin is a thermosetting resin.

* * * * *